(12) United States Patent
Amur Varadarajan et al.

(10) Patent No.: US 12,229,689 B2
(45) Date of Patent: Feb. 18, 2025

(54) HYBRID MODELING PROCESS FOR FORECASTING PHYSICAL SYSTEM PARAMETERS

(71) Applicant: Schlumberger Technology Corporation, Sugar Land, TX (US)

(72) Inventors: Prasanna Amur Varadarajan, Clamart (FR); Maurice Ringer, London (GB)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 994 days.

(21) Appl. No.: 17/248,836

(22) Filed: Feb. 10, 2021

(65) Prior Publication Data

US 2021/0248500 A1  Aug. 12, 2021

Related U.S. Application Data

(60) Provisional application No. 62/972,157, filed on Feb. 10, 2020.

(51) Int. Cl.
*G06N 5/04* (2023.01)
*G01V 20/00* (2024.01)
(Continued)

(52) U.S. Cl.
CPC ............... *G06N 5/04* (2013.01); *G01V 20/00* (2024.01); *G06F 30/27* (2020.01); *G06N 20/00* (2019.01)

(58) Field of Classification Search
None
See application file for complete search history.

(56) References Cited

U.S. PATENT DOCUMENTS

| 2,966,059 A | 12/1960 | Dower |
| 6,234,250 B1 | 5/2001 | Green et al. |

(Continued)

FOREIGN PATENT DOCUMENTS

| CN | 102782252 A | 11/2012 |
| CN | 103184841 A | 7/2013 |

(Continued)

OTHER PUBLICATIONS

Search Report and Written Opinion of International Patent Application No. PCT/US2020/070700 mailed Feb. 1, 2021.

(Continued)

*Primary Examiner* — Haimei Jiang
(74) *Attorney, Agent, or Firm* — Jeffrey D. Frantz

(57) ABSTRACT

A method includes receiving first input values for a first parameter of a physical system, calculating first modeled values for a second parameter using a model that represents the physical system, based on the first input values, receiving measured values for the second parameter, training a machine learning model to adjust modeled values generated by the model based on a difference between the first modeled values and the measured values, receiving second input values for the first parameter, calculating second modeled values for the second parameter using the model, generating adjusted values for the second parameter by adjusting the second modeled values using the trained machine learning model, and visualizing the adjusted values for the second parameter as representing operation of the physical system.

16 Claims, 9 Drawing Sheets

(51) Int. Cl.
*G06F 30/27* (2020.01)
*G06N 20/00* (2019.01)

(56) References Cited

U.S. PATENT DOCUMENTS

| | | | |
|---|---|---|---|
| 10,208,548 B2 | 2/2019 | Francois | |
| 10,502,009 B2 | 12/2019 | Sehsah | |
| 10,683,744 B2 | 6/2020 | Torrione et al. | |
| 10,915,829 B1* | 2/2021 | Wani | G06N 20/00 |
| 11,448,057 B2* | 9/2022 | Samuel | G06N 20/20 |
| 2003/0139916 A1 | 7/2003 | Choe | |
| 2008/0264691 A1 | 10/2008 | Allen | |
| 2011/0220410 A1 | 9/2011 | Aldred et al. | |
| 2012/0292110 A1* | 11/2012 | Downton | E21B 44/00 175/45 |
| 2013/0325351 A1 | 12/2013 | Haberer et al. | |
| 2014/0110167 A1* | 4/2014 | Goebel | G06N 3/08 175/24 |
| 2015/0300151 A1 | 10/2015 | Mohaghegh | |
| 2016/0191163 A1 | 6/2016 | Preston et al. | |
| 2016/0237810 A1 | 8/2016 | Beaman, Jr. | |
| 2016/0266276 A1* | 9/2016 | Stokely | G01V 20/00 |
| 2016/0369621 A1 | 12/2016 | Salminen et al. | |
| 2017/0175467 A1 | 6/2017 | Francois | |
| 2017/0191359 A1* | 7/2017 | Dursun | E21B 45/00 |
| 2017/0292513 A1 | 10/2017 | Haddad et al. | |
| 2017/0314382 A1 | 11/2017 | Torrione | |
| 2018/0247156 A1 | 8/2018 | Holtham et al. | |
| 2019/0017352 A1 | 1/2019 | Chugunov et al. | |
| 2019/0114352 A1 | 4/2019 | Sung | |
| 2019/0188192 A1 | 6/2019 | Hayes et al. | |
| 2019/0345809 A1 | 11/2019 | Jain et al. | |
| 2020/0080410 A1 | 3/2020 | Kjosmoen | |
| 2020/0285216 A1* | 9/2020 | Elyas | E21B 44/00 |
| 2020/0332627 A1* | 10/2020 | Tang | E21B 41/00 |
| 2020/0347700 A1* | 11/2020 | Yu | G01V 1/48 |

FOREIGN PATENT DOCUMENTS

| | | |
|---|---|---|
| CN | 204299513 U | 4/2015 |
| CN | 105952436 A | 9/2016 |
| GB | 2564507 A | 1/2019 |
| KR | 1020190095442 | 8/2019 |
| WO | 2015073017 | 5/2015 |
| WO | 2016205469 | 12/2016 |
| WO | 2018232198 | 12/2018 |
| WO | 2019005908 | 1/2019 |
| WO | 2021072420 | 4/2021 |
| WO | 2021087509 | 5/2021 |
| WO | 2022155681 A1 | 7/2022 |
| WO | 2022165495 A1 | 8/2022 |

OTHER PUBLICATIONS

Search Report and Written Opinion of International Patent Application No. PCT/US2020/070615 mailed Feb. 2, 2021.
Al-Hameedi_Using Machine Learning to Predict Lost Circulation in the Rumaila Field_SPE-191933-MS_2018_16_pages.
Al-Hameedi_Predictive Data Mining Techniques for Mud Losses Mitigation_SPE-192182-MS_2018_19_pages.
Alkinani_Prediction of Lost Circulation Prior to Drilling for Induced Fractures Formations_SPE-195197-MS_2019_9_pages.
Extended Search Report issued in European I Application No. 20873786.8 dated Oct. 12, 2023, 6 pages.
Extended Search Report issued in European Patent Application No. 20883020.8 dated Nov. 6, 2023, 6 pages.
McCann, D. et al., "Computerized flow monitors detect small kicks". Oil & Gas Journal, 1992, 8, 4 pages.
Jarad, Niemi, Bayesian Linear Regression [online], Apr. 23, 2019 [retrieved on Apr. 14, 2021]. Retrieved from the Internet: <URL: https://www.jarad.me/courses/stat544/slides/Ch14/Ch14a.pdf>, pp. 1, 21.
Search Report and Written Opinion of International Patent Application No. PCT/US2022/070371 dated May 10, 2022, 9 pages.
International Preliminary Report on Patentability of International Patent Application No. PCT/US2022/070213 dated May 3, 2022, 9 pages.
First Office Action issued in China Patent Application No. 202080090190.4 dated Dec. 13, 2023, 17 pages with English translation.
Notice of Allowance issued in China Patent Application No. 202080090190.4 dated May 23, 2024, 7 pages with English translation.

* cited by examiner

HYBRID MODELING PROCESS FOR FORECASTING PHYSICAL SYSTEM PARAMETERS

CROSS-REFERENCE TO RELATED APPLICATIONS

This application claims priority to U.S. Provisional Patent Application having Ser. No. 62/972,157, which was filed on Feb. 10, 2020 and is incorporated herein by reference in its entirety.

BACKGROUND

Techniques for monitoring and identifying pressure and flow anomalies present in the wellbore during drilling operations are employed in offshore and land well construction operations. These procedures include comparing modeled and real-time measured data. Inadequate modeling of operational behavior, such as transient mud flows when pumps are started and stopped, pressure fluctuations while tripping and during the pitch and heave movement, increase the risk of missing or misinterpreting a well balance event. Accordingly, some methods build on improving the accuracy of the models to predict the correct behavior of the operations by incorporating appropriate physics into the models.

For example, there are models that compute the pit volume gains, and detecting kicks using differential flowout. Further, real-time transient hydraulics models for the mud circulation in the entire rig hydraulic system have been employed, and facilitate capturing the transient effects in flow rate, standpipe pressure, and bottomhole equivalent circulating density (ECD) during well construction operations. To perform calculations, the models are built into software modules that include the mud parameters, the contextual well data, and the real-time measurements data.

These modules are used as forward simulators based on physical equations. However, rheology and compressibility in such modeling applications are calibrated manually and determined more frequently during changes in operations and external conditions. Also, some physics-based models may omit some physical parameters from real-time modeling. For example, assumptions may be used to reduce 3D physics to a 1D model for computational simplicity.

SUMMARY

Embodiments of the disclosure include a method that includes receiving first input values for a first parameter of a physical system, calculating first modeled values for a second parameter using a model that represents the physical system, based on the first input values, receiving measured values for the second parameter, training a machine learning model to adjust modeled values generated by the model based on a difference between the first modeled values and the measured values, receiving second input values for the first parameter, calculating second modeled values for the second parameter using the model, generating adjusted values for the second parameter by adjusting the second modeled values using the trained machine learning model, and visualizing the adjusted values for the second parameter as representing operation of the physical system.

Embodiments of the disclosure also include a computing system including one or more processors, and a memory system including one or more non-transitory computer-readable media storing instructions that, when executed by at least one of the one or more processors, cause the computing system to perform operations. The operations include receiving first input values for a first parameter of a physical system, calculating first modeled values for a second parameter using a model that represents the physical system, based on the first input values, receiving measured values for the second parameter, training a machine learning model to adjust modeled values generated by the model based on a difference between the first modeled values and the measured values, receiving second input values for the first parameter, calculating second modeled values for the second parameter using the model, generating adjusted values for the second parameter by adjusting the second modeled values using the trained machine learning model, and visualizing the adjusted values for the second parameter as representing operation of the physical system.

A non-transitory computer-readable medium storing instructions that, when executed by at least one processor of a computing system, cause the computing system to perform operations. The operations include receiving first input values for a first parameter of a physical system, calculating first modeled values for a second parameter using a model that represents the physical system, based on the first input values, receiving measured values for the second parameter, training a machine learning model to adjust modeled values generated by the model based on a difference between the first modeled values and the measured values, receiving second input values for the first parameter, calculating second modeled values for the second parameter using the model, generating adjusted values for the second parameter by adjusting the second modeled values using the trained machine learning model, and visualizing the adjusted values for the second parameter as representing operation of the physical system.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Reference will now be made in detail to embodiments, examples of which are illustrated in the accompanying drawings and figures. In the following detailed description, numerous specific details are set forth in order to provide a thorough understanding of the invention. However, it will be apparent to one of ordinary skill in the art that the invention may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the present disclosure. The first object or step, and the second object or step, are both, objects or steps, respectively, but they are not to be considered the same object or step.

The terminology used in the description herein is for the purpose of describing particular embodiments and is not intended to be limiting. As used in this description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

Figure 1:
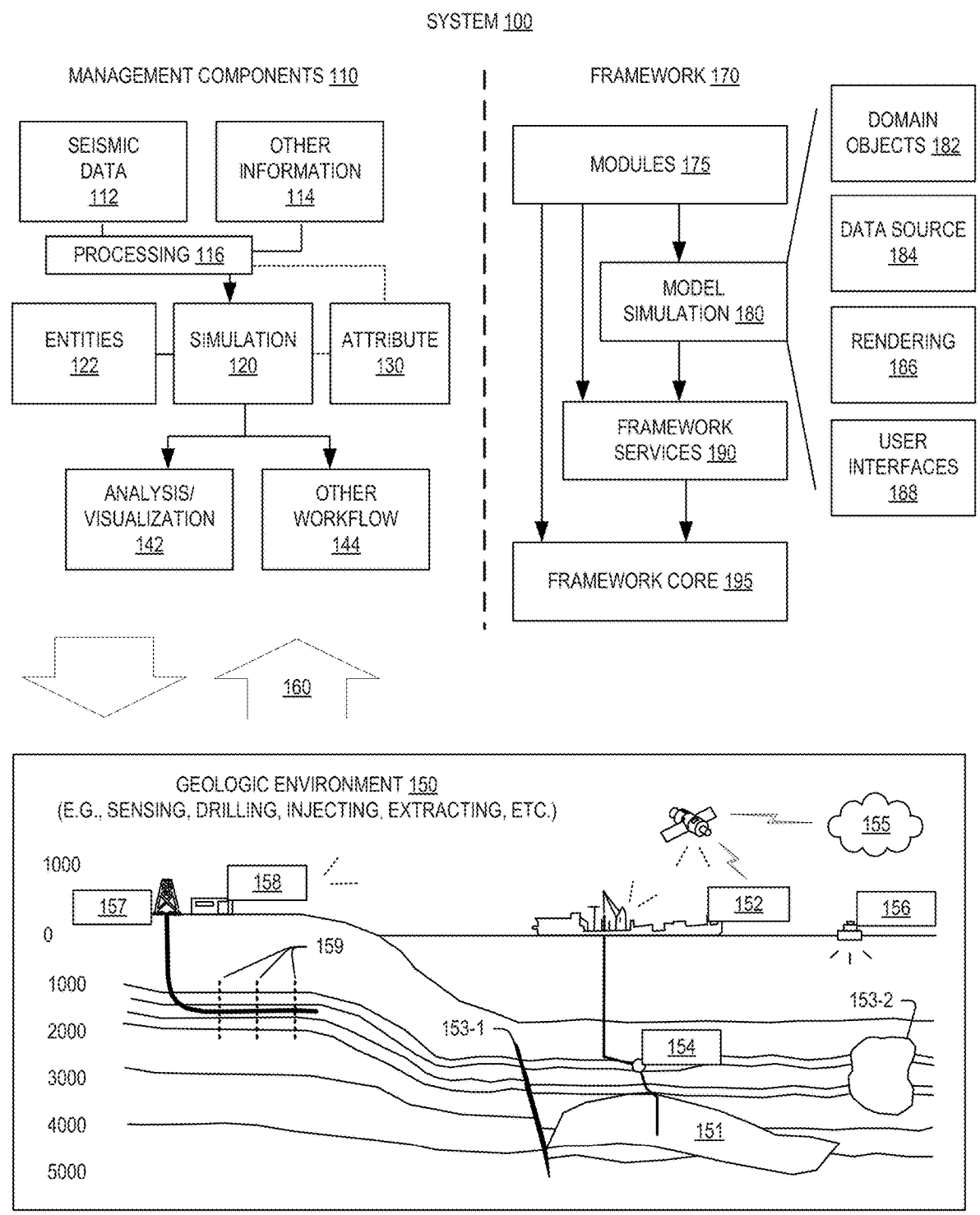
FIG. 1 illustrates an example of a system that includes various management components to manage various aspects of a geologic environment, according to an embodiment.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFTR® .NET® framework (Redmond, Washington), which provides a set of extensible object classes. In the .NET® framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Texas), the INTERSECT™ reservoir simulator (Schlumberger Limited, Houston Texas), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Texas). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Texas) allows for integration of add-ons (or plug-ins) into a PETREL® framework workflow. The OCEAN® framework environment leverages .NET® tools (Microsoft Corporation, Redmond, Washington) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or instead include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

Figure 2:
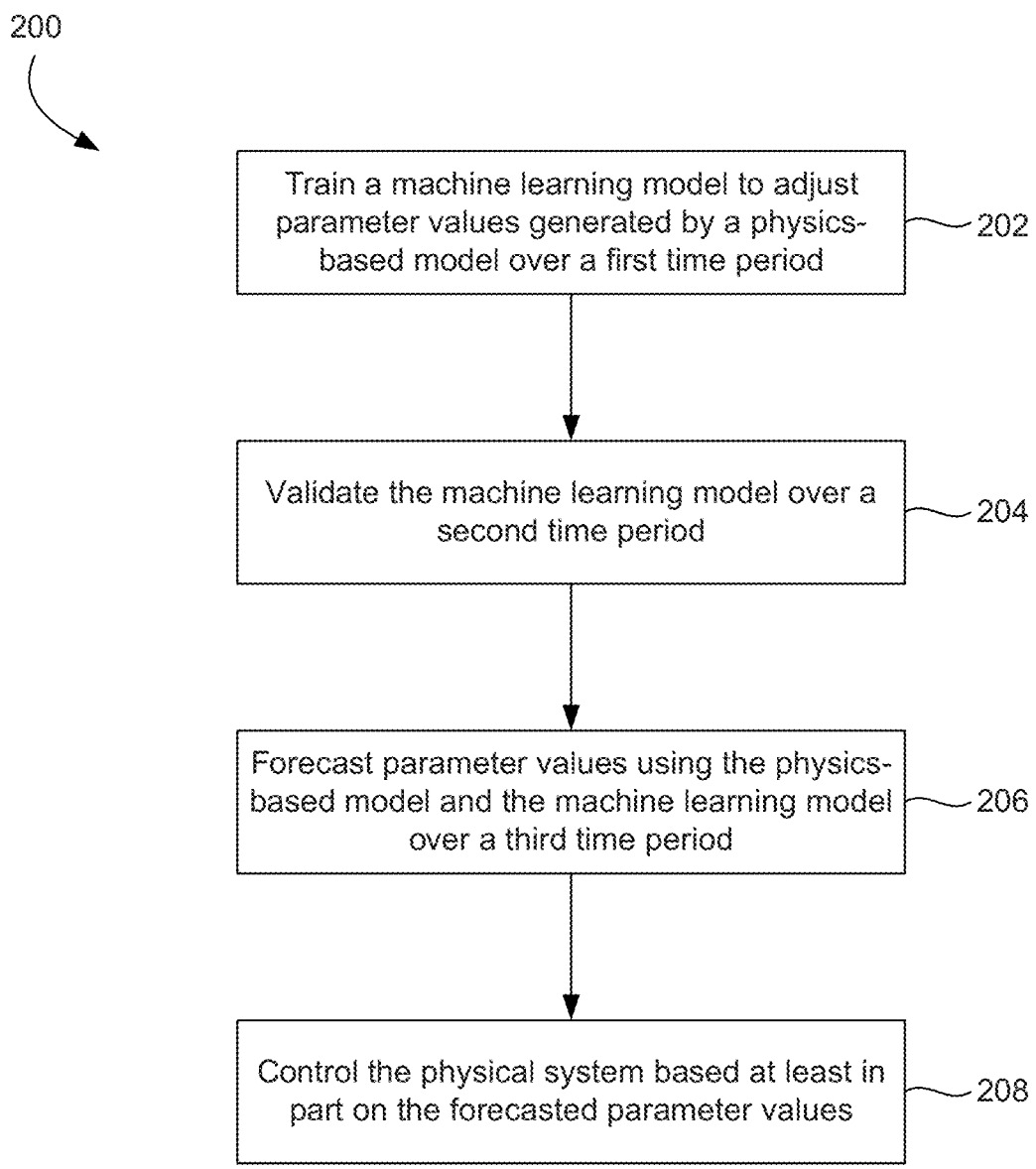
FIG. 2 illustrates a flowchart of a method for predicting parameter values in a physical system, according to an embodiment.

FIG. 2 illustrates a flowchart of a method 200 for predicting parameter values in a physical system, according to an embodiment. At least some embodiments of the method 200 may be used to control/adjust the operation of the physical system, such as by adjusting operating parameters, in response to the predictions. Moreover, at least some embodiments of the method 200 may be employed to predict that an event, which may represent a safety or operational hazard, is likely, and may recommend or execute actions to mitigate the risk of such events occurring. These and other practical applications will be understood with reference to the following example embodiments.

Figure 3:
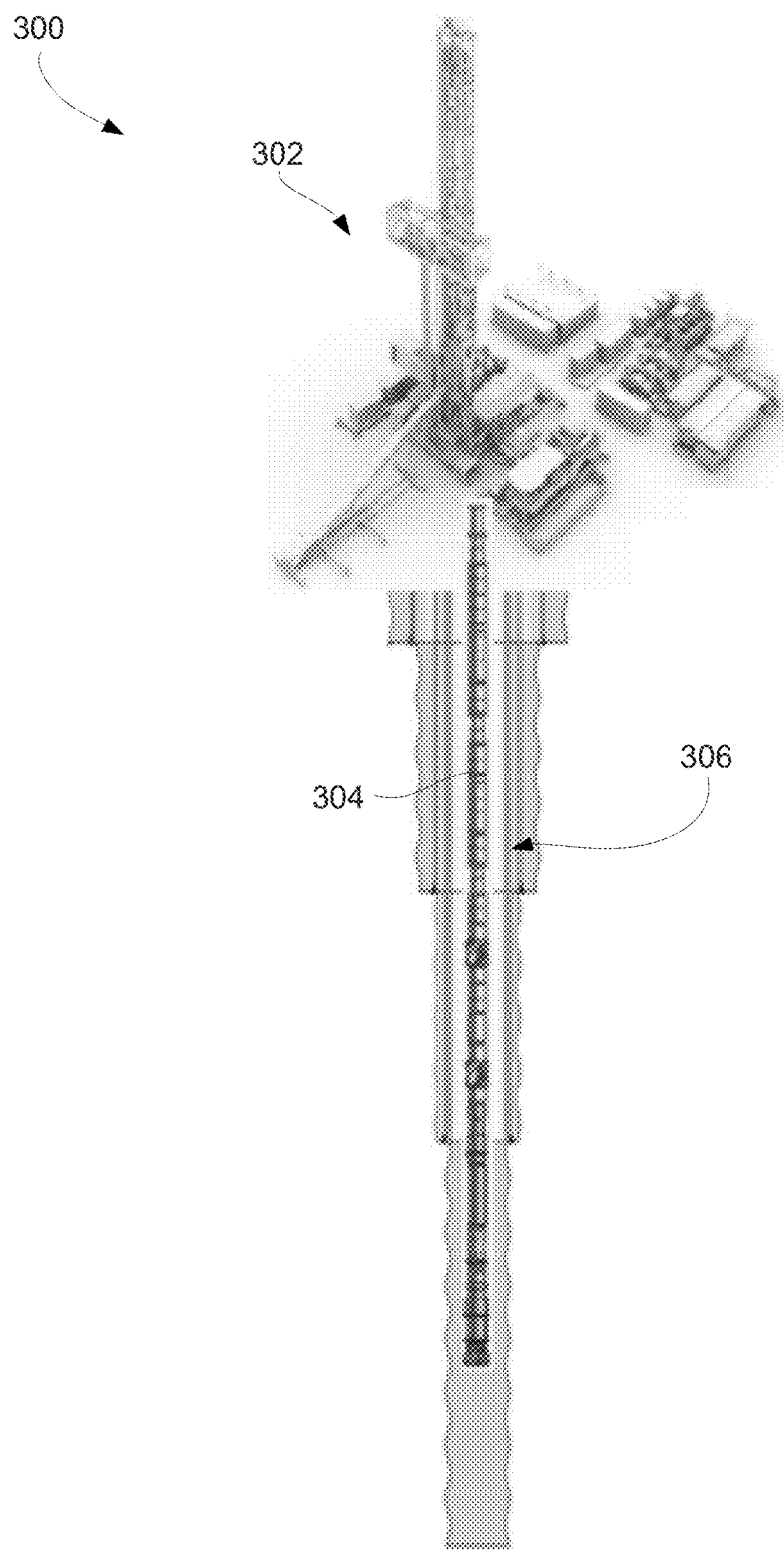
FIG. 3 illustrates a conceptual view of a well site system modeled by the physics-based model, according to an embodiment.

As shown in FIG. 2, the method 200 includes training a machine learning model to adjust parameter values generated by a physics-based model over a first or "training" time period, as at 202. The physics-based model may represent a physical system and may be used to simulate parameters of the physical system in the future (i.e., in advance of its current state of operations). For example, the physical system may be a well system, such as that schematically illustrated in FIG. 3 and generally indicated by reference number 300. As shown in FIG. 3, the system 300 may include surface components 302 and downhole components 304, which may be located in a well 306.

In a specific embodiment, the physics-based model may be used to calculate standpipe pressure and/or equivalent circulating density in the well 306. In order to calculate these parameters (and/or others), the physics-based model may receive input parameters, which may generally relate to the physical characteristics of the equipment, fluid, and well of the well system 300. For example, the physics-based model may receive parameters representing wellbore architecture, drill string characteristics, bit nozzle characteristics, booster line operation, flowline geometry, fluid properties (e.g., compressibility and rheology), rig state, and others. The physics-based model, which may be or include a hydraulic model, may convert rheology input to Herschel-Buckley parameters, and fine tune the gel, bypass, and bell nipple coefficients. Output parameters of the model (e.g., "modeled" parameters) may include flow out of bell nipple, rheology at different depths in the well, equivalent circulating density (ECD) at the casing shoe, bottom hole pressure, inner string pressure, ECD and/or equivalent static density (ESD) at the bit, and volumetric flow at various points along the well system 300. The modeled parameters may be representative of a current state of the physical system 300 and/or forecast into the future using the model.

Many of the inputs may be taken in real-time, and the physics-based model may use these inputs to update its prediction of the output parameters. However, at least some of the inputs may be available intermittently or infrequently, not in real time, such as after an analysis by a lab is conducted. Rheology and compressibility may be two examples of such inputs. These physical characteristics of the well system 300 may change over time, however, as the well is drilled. For example, the inputs may change because of the presence of new thermal profiles, etc. Thus, some complexities of the system 300 may not be fully accounted for in the physics-based model. Accordingly, the calculated outputs of the model may drift away from accurate (i.e., corresponding to the actual value, if it were measured directly) the further away from present time that the physical system is simulated and/or the further away from receipt of new intermittently-available inputs. In the present disclosure, the machine learning model may be implemented to adjust the model outputs to account for such drift (or other error, such as offset), thereby maintaining a higher level of accuracy between input availability and/or permitting more accurate parameter forecasting.

Returning to FIG. 2, once the machine learning model is trained at 202, the method 200 may proceed to validating the machine learning model over a second time period, as at 204. The second or "validation" time period may immediately follow the first time period. The validation action at 204 may be employed to verify that the machine learning model was not trained at 202 based on spurious or anomalous data. For example, if an unusual event (e.g., equipment change, sensor malfunction, etc.) occurred during the training time period, it may negatively impact the accuracy of the machine learning model, as the machine learning model may be tuned to expect the anomalous data.

If the machine learning model is verified, the method 200 proceeds to using the machine learning model to forecast parameters, as at 206. In particular, at 206, the method 200 may include forecasting parameter values using the physics-based model and the machine learning model over a third or "implementation" time period, which may be at least partially in the future, i.e., ahead of the current state of operation. Even with the machine learning model adjusting the modeled parameters from the physics-based model, the output may diminish in accuracy over time, and thus the implementation time period may be finite. For example, the time periods may be set based on an amount that the well is advanced, e.g., a certain number of casing or drill pipe joints, etc., or any other metric that may provide a convenient and useful stopping point for the forecasting.

As noted above, the method 200 may then proceed to controlling the physical system based at least in part on the forecasted parameter values, as at 208. For example, a computer executing the machine learning model in combination with the physics-based model may prescribe changes in the operating parameters of the well system 300, which may be implemented automatically or displayed to a user, e.g., along with a recommendation, alarm, etc. Further, in some embodiments, the adjusted values may be visualized to a user, so that a user can track or change the operation of the well system 300 more efficiently and accurately. In still other embodiments, the risk of an event occurring based on the adjusted parameter values may be determined, and actions may be taken or recommended to mitigate such risk.

Figure 4A:
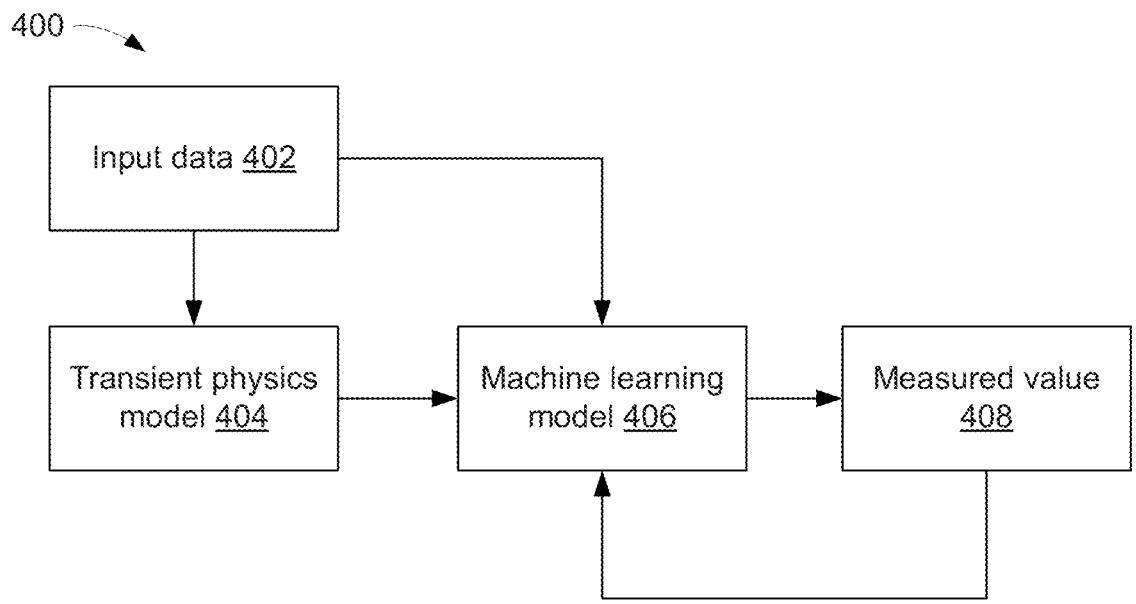
FIG. 4A illustrates a control block diagram of a training stage of the method, according to an embodiment.

FIG. 4A illustrates a control block diagram of a training stage 400, generally corresponding to boxes 202 and 204 in FIG. 2, of the method 200, according to an embodiment. As shown, the training stage 400 may generally include receiving input data at 402. The input data at 402 may be fed to a transient physics model 404, which models the operation of the physical system (e.g., the well system 300). The transient physics model 404 uses the input to generate a modeled output value for one or more parameters (e.g., standpipe pressure, ECD, etc.). The input data 402 and/or the modeled output value are then fed to the machine learning model at 406. The machine learning model 406 also receives feedback information from a measured value at 408 (e.g., sensors, etc., taking real-time measurements). The machine learning model 406 may thus be configured to use the measured value along with the input data and/or the modeled data as a ground truth, which may be employed to make connections between the modeled value of the parameter, e.g., over time, and what the actual measurement would be, such that the machine learning model is able to account for the differences therebetween. That is, in some cases, the machine learning model 406 is trained to predict the difference between the modeled value and the measured value, and account for the difference by adjusting the output from the physics model 404 (e.g., by changing modeling coefficients, directly adding/subtracting from the output of the model, etc.).

Figure 4B:
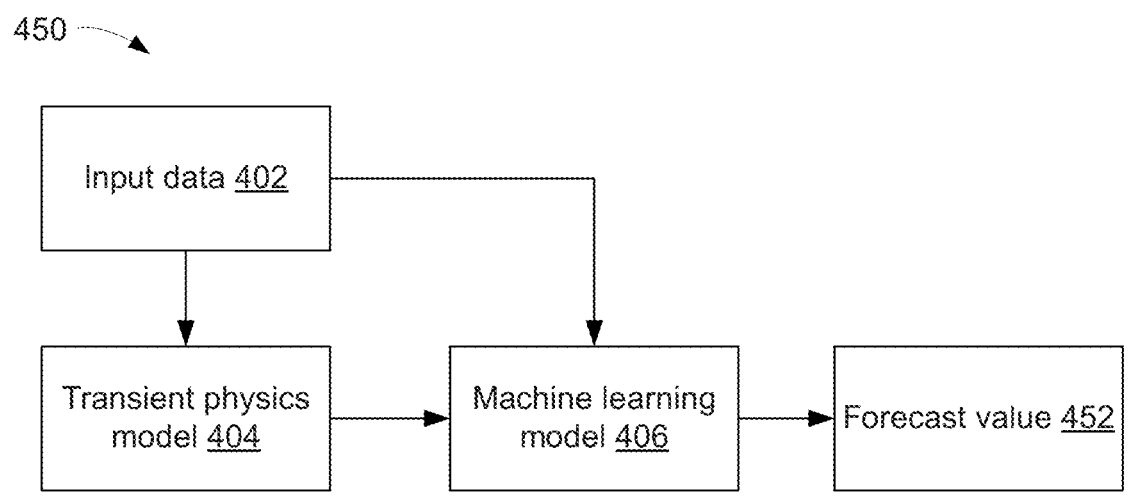
FIG. 4B illustrates a control block diagram of an implementation stage of the method, according to an embodiment.

FIG. 4B illustrates a control block diagram of an implementation stage 450, generally corresponding to box 206 of FIG. 2, of the method 200, according to an embodiment. The implementation stage 450 may be similar to the training stage 400, except instead of a measured value 408, the output of the machine learning model (e.g., the adjusted value) provides a forecast value at 452. This forecast value 452 thus serves as the basis for subsequent visualizations of operation of the well system 300, decisions, and/or operations, e.g., determining the risk of a hazard, a stuck pipe, loss of well integrity, pressure kick, or another event, and taking actions to mitigate such risk. In some embodiments, the forecast value 452 may be compared with measured values when they become available (i.e., at some point in the future) in order to further train the machine learning model.

Figure 5A:
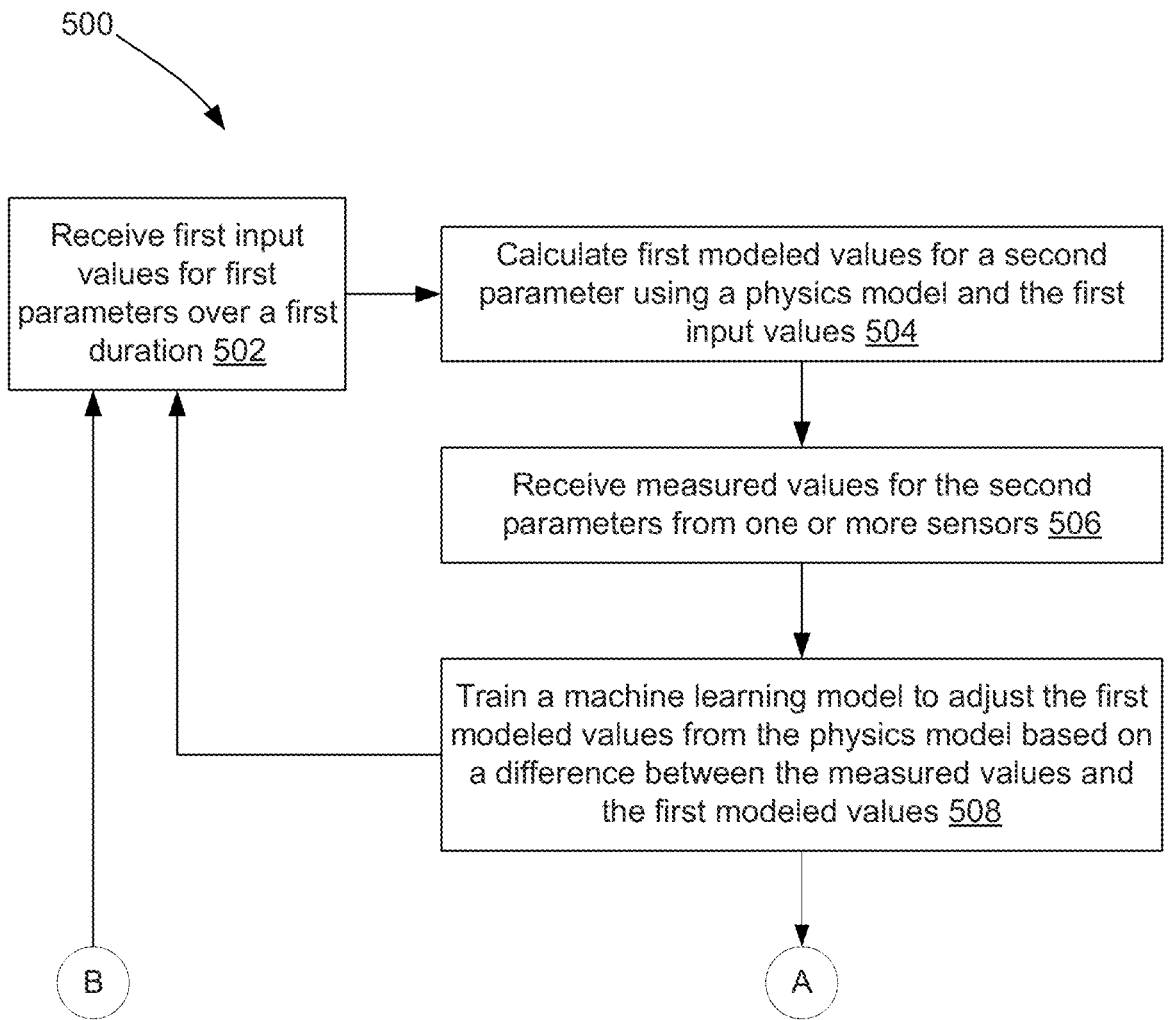
FIGS. 5A, 5B, and 5C illustrate a flowchart of a method for controlling a physical system using a hybrid physics-based model and machine learning model approach, according to an embodiment.
Figure 5B:
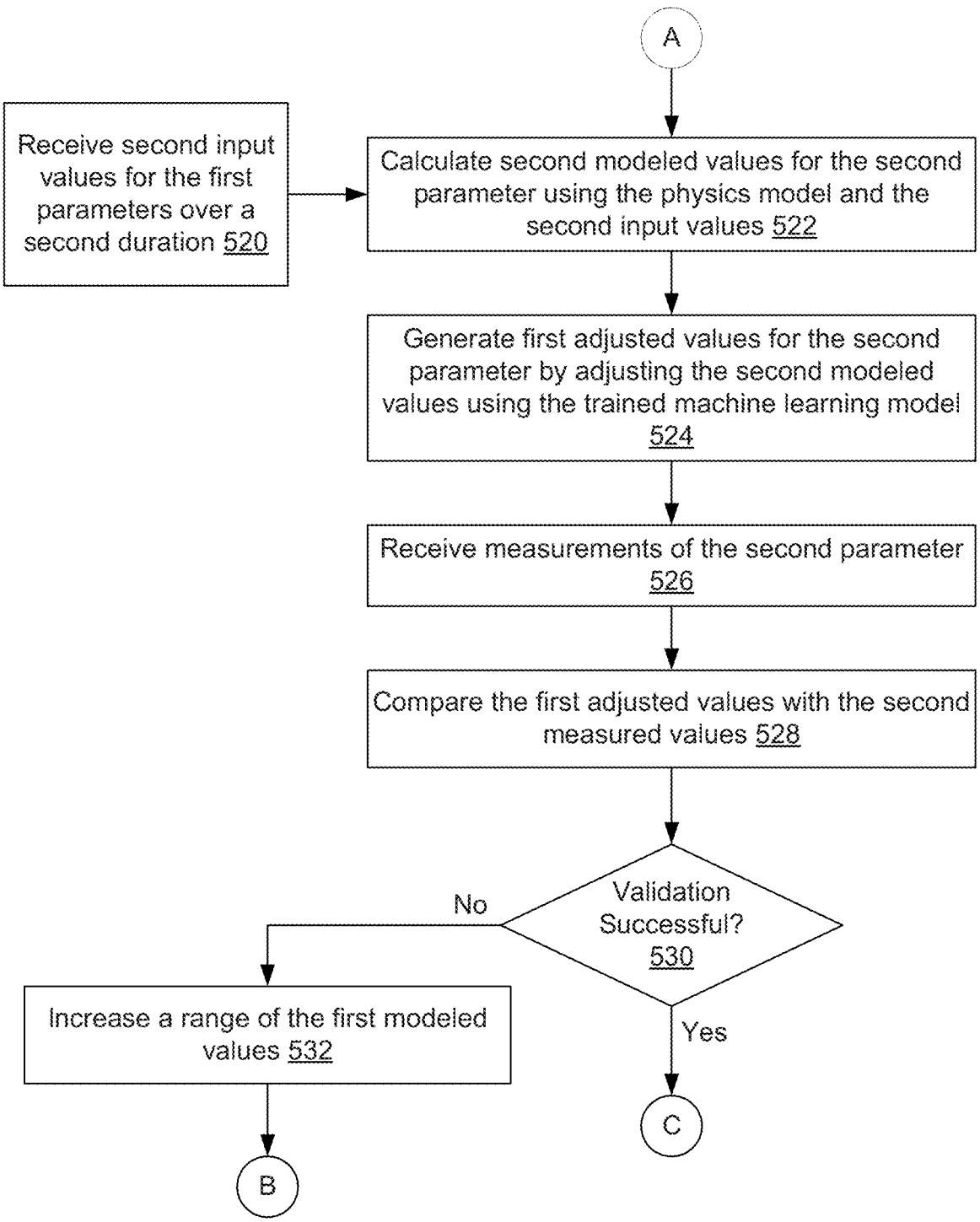
Figure 5C:
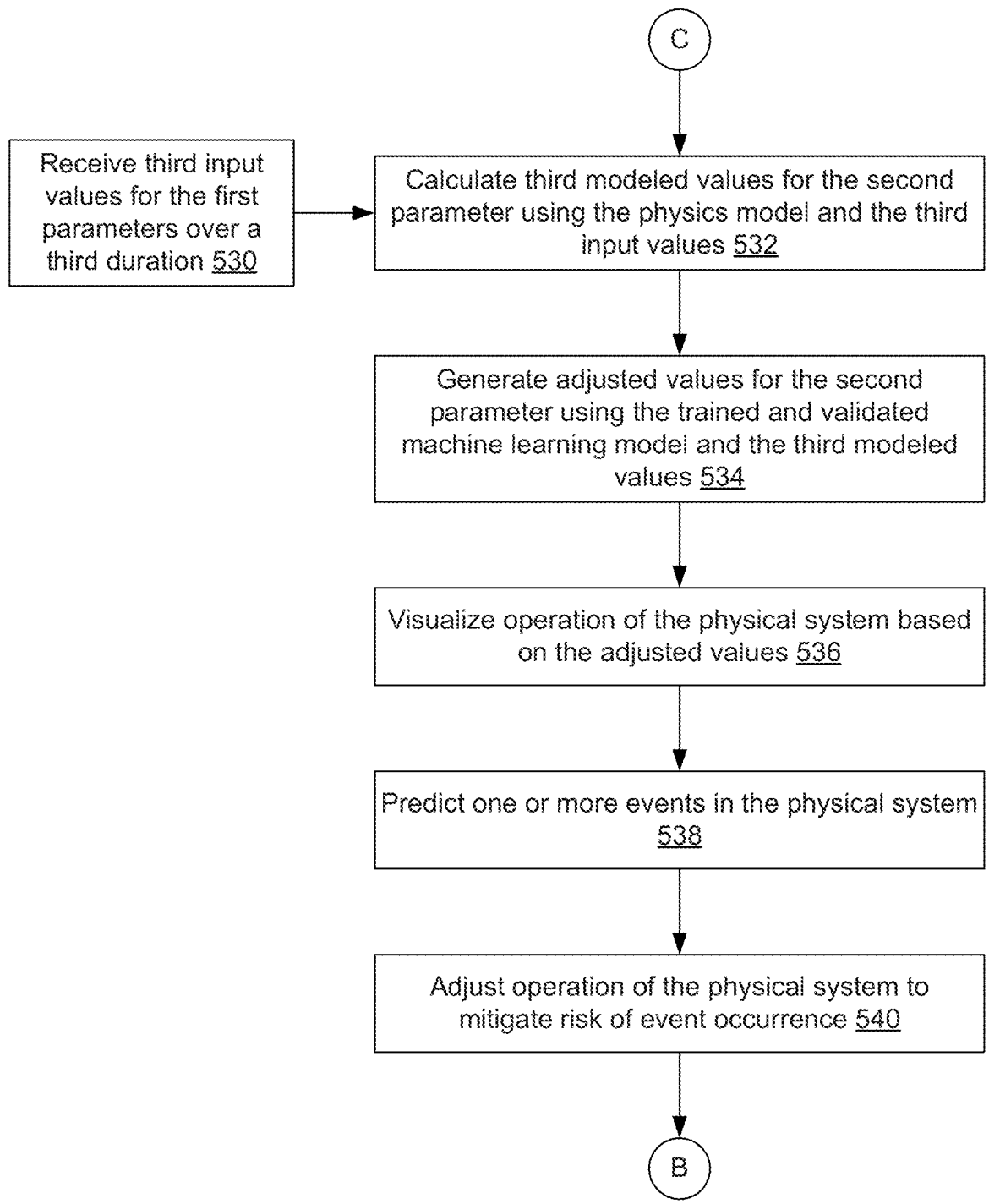

FIGS. 5A-5C illustrates a flowchart of a method 500 for controlling a physical system using a hybrid physics-based model and machine learning model approach, according to an embodiment. The method 500 may include receiving, as at 502, first input values for first parameters over a first duration. The first duration may be a training duration and may be first-in-time after one or more parameters that are not available in real-time are received as input. Since the accuracy of the physics-based model may be highest during this duration, as compared to subsequent durations, it may be used to train the machine-learning model. The first input values may be measured or otherwise calculated outside of the physics-based model. As noted above, the first input values may be or include values for any one or more parameters such as wellbore architecture, drill string characteristics, bit nozzle characteristics, booster line operation, flowline geometry, fluid properties (e.g., compressibility and rheology), rig state, and/or others.

The first input values received at 502 may be provided to the physics-based model (e.g., a hydraulic model), as at 504, which may generate first modeled values for a second parameter using the first input values. For example, a single second parameter (e.g., ECD or standpipe pressure) may be calculated potentially many times over the course of the first duration, e.g., using the different first input values. Alternatively, one or more values for two or more second parameters may be provided (e.g., both ECD and standpipe and/or others).

During the first duration, measured values may also be collected from sensors of the well system 300, e.g., positioned in the well 306, as at 506. The measured values may be considered the ground truths for training purposes. Accordingly, the method 500 may include training the machine learning model to adjust the first modeled values (either directly or by adjusting the physics-based model) based on a difference between the measured values and the first modeled values, as at 508.

Once trained, the machine learning model may be validated, e.g., in order to account for the possibility that anomalous or otherwise non-representative data was used to train the model. Accordingly, in FIG. 5B, the method 500 may receive second input values for the first parameters over a second or "validation" duration, as at 520. The validation duration may follow (e.g., immediately follow) the training duration.

The second input values may then be used to calculate second modeled values for the second parameter using the physics model, as at 522. During the validation duration, first adjusted values may then be generated for the second parameter by adjusting the second modeled values (e.g., either directly or by adjusting the calculation performed by the physics-based model) using the machine learning model that was previously trained during the training duration, as at 524.

During the validation duration, like the training duration, measurements of the second parameter(s) may be available. Accordingly, such measurements may be received at 524 and compared with the first adjusted values, as at 526. The method 500 may then include evaluating whether the validation was successful, e.g., if the first adjusted values are within a predetermined range of the measured values, as at 528. If they are, validation is successful (528: Yes). If not (528: No), either the physics-based model, the machine learning model, or both may be adjusted. For example, the range of the first modeled values from the physics model may be increased, as at 530. Additionally or instead, the machine learning model may return to the training stage and be retrained, as explained above with respect to FIG. 5A.

After the machine learning model is validated, the method 500 may proceed to the implementation stage, in which the method 500 may predict future values for the second parameter, e.g., the ECD or standpipe pressure, based on inputs that are available in real time, and inputs that are not available in real-time. Accordingly, in FIG. 5C, the method 500 may proceed to receiving third input values for the first parameters over a third duration, as at 530. The third duration is an implementation duration and may follow (e.g., immediately follow) the second, validation duration. The third duration may extend for a predetermined amount of time, until a predetermined action (e.g., a certain number of casing joints are run into the well, etc.), or until some other time period elapses.

The method 500 may then include calculating third modeled values for the second parameter using the physics model and the third input values, as at 532. The method 500 may then include generating adjusted values for the second parameter using the trained and validated machine learning model and the third modeled values, as at 534. This may proceed by the machine learning model predicting the difference between the third modeled values and the actual (what would be measured) values for the second parameter and directly modifying the output of the physics-based model, or by adjusting the physics-based model.

Figure 6:
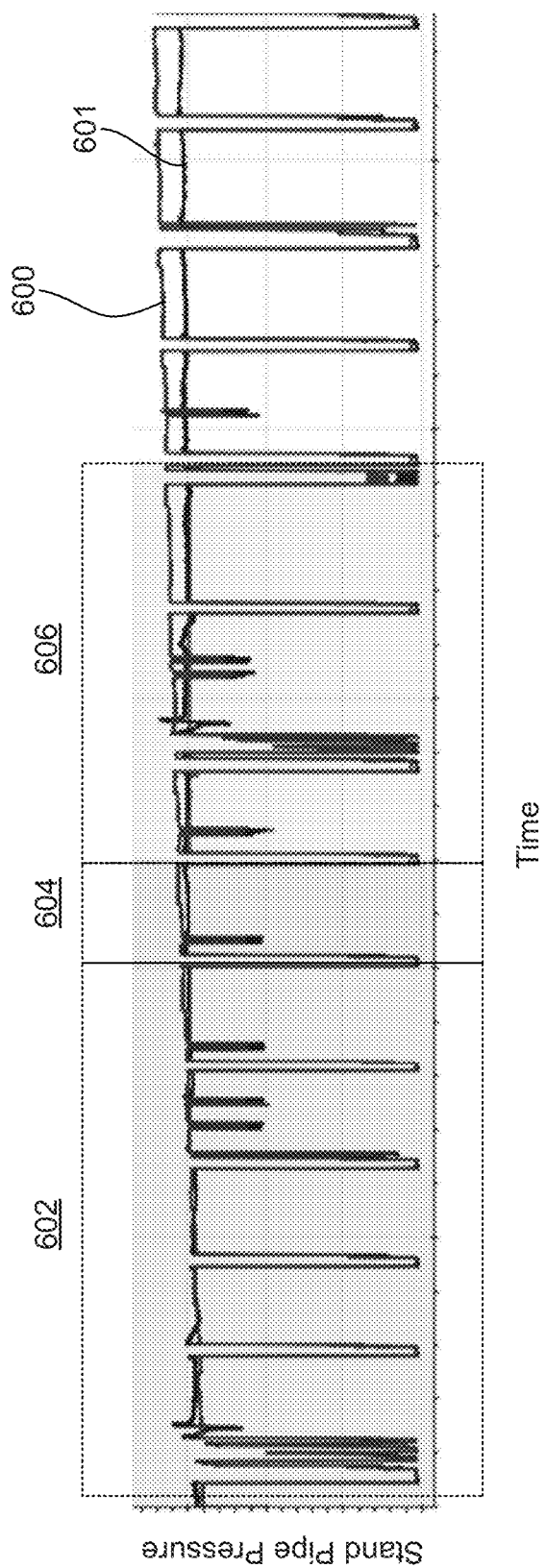
FIG. 6 illustrates a plot of a predicted parameter, according to an embodiment.

The method 500 may then include visualizing operation of the physical system (i.e., what is modeled by the physics-based model), e.g., in the future, based on the adjusted values 536. FIG. 6 illustrates an example of such a visualization. In this view, standpipe pressure is plotted as a function of time, along line 600, using the adjusted values, although this is merely one example. As shown, the standpipe pressure plot is broken into three periods: the training duration 602, the validation duration 604, and the implementation duration 606. For reference, line 601 represents modeled values from the physics model without correction/adjustment from the machine learning model. As can be seen, the physics model values represented by line 601 are more accurate during the training duration 602, but drift away from the more accurate adjusted values of line 601 in the validation and implementation durations 604, 606. The measured values are nearly identical to the adjusted values.

Returning to FIG. 5C, the method 500 may also include predicting one or more events in the physical system, as at 538. The second parameter(s) that are predicted may produce trends or otherwise indicate to operators or a processor that an event, such as a wellbore integrity event, is imminent or at least at risk of occurring. Accordingly, the method 500 may include adjusting operation of the physical system to mitigate the risk of such an event occurring, as at 540. The method 500 may also include looping back to the training stage, e.g., when new parameter values (those not available in real time) become available, which may be used to further train or retrain the machine learning model in preparation for the next implementation stage.

Figure 7:
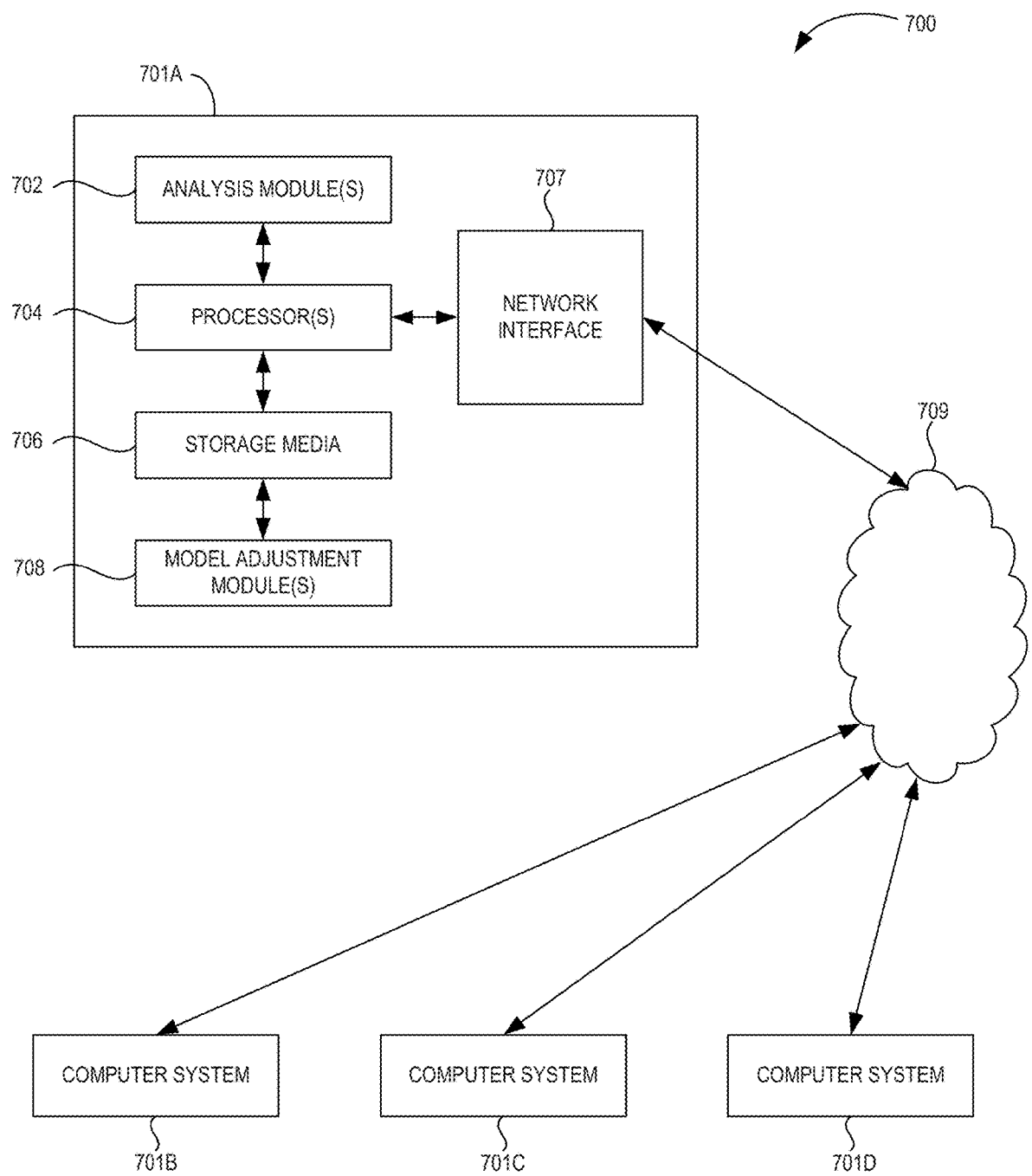
FIG. 7 illustrates a schematic view of a computing system, according to an embodiment.

In some embodiments, the methods of the present disclosure may be executed by a computing system. FIG. 7 illustrates an example of such a computing system 700, in accordance with some embodiments. The computing system 700 may include a computer or computer system 701A, which may be an individual computer system 701A or an arrangement of distributed computer systems. The computer system 701A includes one or more analysis modules 702 that are configured to perform various tasks according to some embodiments, such as one or more methods disclosed herein. To perform these various tasks, the analysis module 702 executes independently, or in coordination with, one or more processors 704, which is (or are) connected to one or more storage media 706. The processor(s) 704 is (or are) also connected to a network interface 707 to allow the computer system 701A to communicate over a data network 709 with one or more additional computer systems and/or computing systems, such as 701B, 701C, and/or 701D (note that computer systems 701B, 701C and/or 701D may or may not share the same architecture as computer system 701A, and may be located in different physical locations, e.g., computer systems 701A and 701B may be located in a processing facility, while in communication with one or more computer systems such as 701C and/or 701D that are located in one or more data centers, and/or located in varying countries on different continents).

A processor may include a microprocessor, microcontroller, processor module or subsystem, programmable integrated circuit, programmable gate array, or another control or computing device.

The storage media 706 may be implemented as one or more computer-readable or machine-readable storage media. Note that while in the example embodiment of FIG. 7 storage media 706 is depicted as within computer system 701A, in some embodiments, storage media 706 may be distributed within and/or across multiple internal and/or external enclosures of computing system 701A and/or additional computing systems. Storage media 706 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 700 contains one or more model adjustment module(s) 708. In the example of computing system 700, computer system 701A includes the model adjustment module 708. In some embodiments, a single model adjustment module may be used to perform some aspects of one or more embodiments of the methods disclosed herein. In other embodiments, a plurality of model adjustment modules may be used to perform some aspects of methods herein.

It should be appreciated that computing system 700 is merely one example of a computing system, and that computing system 700 may have more or fewer components than shown, may combine additional components not depicted in the example embodiment of FIG. 7, and/or computing system 700 may have a different configuration or arrangement of the components depicted in FIG. 7. The various components shown in FIG. 7 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAS, PLDs, or other appropriate devices. These modules, combinations of these modules, and/or their combination with general hardware are included within the scope of the present disclosure.

Computational interpretations, models, and/or other interpretation aids may be refined in an iterative fashion; this concept is applicable to the methods discussed herein. This may include use of feedback loops executed on an algorithmic basis, such as at a computing device (e.g., computing system 700, FIG. 7), and/or through manual control by a user who may make determinations regarding whether a given step, action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or limiting to the precise forms disclosed. Many modifications and variations are possible in view of the above teachings. Moreover, the order in which the elements of the methods described herein are illustrate and described may be re-arranged, and/or two or more elements may occur simultaneously. The embodiments were chosen and described in order to best explain the principles of the disclosure and its practical applications, to thereby enable others skilled in the art to best utilize the disclosed embodiments and various embodiments with various modifications as are suited to the particular use contemplated.

What is claimed is:

1. A method, comprising:
   training a machine learning model to adjust modeled values generated by a physics model of a well system, wherein the training the machine learning model comprises:
   receiving first input values for a first parameter of the well system, the well system including one or more surface components and one or more downhole components, wherein the first input values indicate at least one of: one or more parameters of the one or more surface components, one or more parameters of the one or more downhole components, or one or more parameters of a fluid in the well system;
   calculating first modeled values for a second parameter using the physics model that represents the well system, wherein the calculating is based on the first input values, wherein the second parameter indicates a predicted current state or a predicted future state of the well system;

receiving, from one or more physical sensors in the well system, measured values for the second parameter; and inputting the measured values for the second parameter and the first modeled values for the second parameter to the machine learning model to train the machine learning model to predict adjusted modeled values based on a difference between the first modeled values and the measured values;

receiving, by one or more processors of a computing system, second input values for the first parameter;

calculating, by the one or more processors of the computing system, second modeled values for the second parameter using the physics model;

generating, by the one or more processors of the computing system, adjusted values for the second parameter by adjusting the second modeled values using the trained machine learning model;

visualizing, by the one or more processors of the computing system, the adjusted values for the second parameter as representing operation of the well system;

predicting, by the one or more processors of the computing system, a wellbore-integrity event based on the adjusted values; and controlling operation of the well system based on the predicted wellbore-integrity event, wherein controlling the operation includes adjusting one or more operating parameters of the well system to mitigate a risk of the wellbore-integrity event.

2. The method of claim 1, wherein generating adjusted values for the second parameter comprises predicting the adjusted values for the second parameter in a future time.

3. The method of claim 1, wherein the first input values are received over a first time duration, and wherein the second input values are received over a second time duration, the first time duration preceding the second time duration.

4. The method of claim 3, further comprising validating the training of the machine learning model, comprising:
receiving third input values for the first parameter;
calculating third modeled values for the second parameter using the physics model;
generating second adjusted values for the second parameter using the trained machine learning model;
receiving third measurement values during a third duration that is between the first time duration and the second time duration; and
determining that the machine learning model was not trained using anomalous operating conditions for the well system based on a comparison of the third measured values and the second adjusted values.

5. The method of claim 3, further comprising validating the training of the machine learning model, comprising:
receiving third input values for the first parameter;
calculating third modeled values for the second parameter using the physics model;
generating second adjusted values for the second parameter using the trained machine learning model;
receiving third measurement values during a third duration that is between the first time duration and the second time duration; and
determining that the second adjusted values are not valid based on a comparison of the second adjusted values and the third measured values; and in response to determining that the second adjusted values are not valid, expanding an output range for the physics model, retraining the machine learning model, or both.

6. The method of claim 1, wherein:
the physics model is a physics-based hydraulic model configured to calculate standpipe pressure, bottom hole effective circulating density, or both based at least partially on fluid rheology; and
the second parameter comprises fluid rheology, fluid compressibility, or both in fluid in the well system.

7. A computing system, comprising:
one or more processors; and
a memory system including one or more non-transitory computer-readable media storing instructions that, when executed by at least one of the one or more processors, cause the computing system to perform operations, the operations comprising:
training a machine learning model to adjust modeled values generated by a physics model of a well system, wherein the training comprises:
receiving first input values for a first parameter of the well system, the well system including one or more surface components and one or more downhole components, wherein the first input values indicate at least one of: one or more parameters of the one or more surface components, one or more parameters of the one or more downhole components, or one of more parameters of a fluid in the well system;
calculating first modeled values for a second parameter using the physics model that represents the well system, wherein the calculating is based on the first input values, and wherein the second parameter indicates a predicted current state or a predicted future state of the well system;
receiving, from one or more physical sensors in the well system, measured values for the second parameter; and
inputting the measured values for the second parameter and the first modeled values for the second parameter to the machine learning model to train the machine learning model to predict adjusted modeled values based on a difference between the first modeled values and the measured values;
receiving second input values for the first parameter;
calculating second modeled values for the second parameter using the physics model;
generating adjusted values for the second parameter by adjusting the second modeled values using the trained machine learning model;
visualizing, to a user, the adjusted values for the second parameter as representing operation of the well system;
predicting a wellbore-integrity event based on the adjusted values; and
controlling operation of the well system based on the predicted wellbore-integrity event, wherein controlling the operation includes adjusting one or more operating parameters of the well system to mitigate a risk of the wellbore-integrity event.

8. The computing system of claim 7, wherein generating adjusted values for the second parameter comprises predicting the adjusted values for the second parameter in a future time.

9. The computing system of claim 7, wherein the first input values are received over a first time duration, and wherein the second input values are received over a second time duration, the first time duration preceding the second time duration.

10. The computing system of claim 9, wherein the operations further comprise validating the training of the machine learning model, the validating of the training of the machine learning model comprising:
receiving third input values for the first parameter;
calculating third modeled values for the second parameter using the physics model;
generating second adjusted values for the second parameter using the trained machine learning model;
receiving third measurement values during a third duration that is between the first time duration and the second time duration; and
determining that the machine learning model was not trained using anomalous operating conditions for the well system based on a comparison of the third measured values and the second adjusted values.

11. The computing system of claim 9, wherein the operations further comprise validating the training of the machine learning model, the validating of the training of the machine learning model comprising:
receiving third input values for the first parameter;
calculating third modeled values for the second parameter using the physics model;
generating second adjusted values for the second parameter using the trained machine learning model;
receiving third measurement values during a third duration that is between the first time duration and the second time duration; and
determining that the second adjusted values are not valid based on a comparison of the second adjusted values and the third measured values; and
in response to determining that the second adjusted values are not valid, expanding an output range for the physics model, retraining the machine learning model, or both.

12. The computing system of claim 7, wherein:
the physics model is a physics-based hydraulic model configured to calculate standpipe pressure, bottom hole effective circulating density, or both based at least partially on fluid rheology; and
the second parameter comprises fluid rheology, fluid compressibility, or both in fluid in the well system.

13. A non-transitory computer-readable medium storing instructions that, when executed by at least one processor of a computing system, cause the computing system to perform operations, the operations comprising:
training a machine learning model to adjust modeled values generated by a physics model of a well system, wherein the training comprises:
receiving first input values for a first parameter of the well system, the well system including one or more surface components and one or more downhole components, wherein the first input values indicate at least one of: one or more parameters of the one or more surface components, one or more parameters of the one or more downhole components, or one of more parameters of a fluid in the well system;
calculating first modeled values for a second parameter using the physics model that represents the well system, wherein the calculating is based on the first input values, wherein the second parameter indicates a predicted current state or a predicted future state of the well system;
receiving, from one or more physical sensors in the well system, measured values for the second parameter; and
inputting the measured values for the second parameter and the first modeled values for the second parameter to the machine learning model to train the machine learning model to predict adjusted modeled values based on a difference between the first modeled values and the measured values;
receiving, by the at least one processor of the computing system, second input values for the first parameter;
calculating, by the at least one processor of the computing system, second modeled values for the second parameter using the physics model;
generating, by the at least one processor of the computing system, adjusted values for the second parameter by adjusting the second modeled values using the trained machine learning model;
visualizing, by the at least one processor of the computing system, to a user, the adjusted values for the second parameter as representing operation of the well system;
predicting, by the at least one processor of the computing system, a wellbore-integrity event based on the adjusted values; and
controlling operation of the well system based on the predicted wellbore-integrity event, wherein controlling the operation includes adjusting one or more operating parameters of the well system to mitigate a risk of the wellbore-integrity event.

14. The medium of claim 13, wherein generating adjusted values for the second parameter comprises predicting the adjusted values for the second parameter in a future time.

15. The medium of claim 13, wherein:
the first input values are received over a first time duration, and wherein the second input values are received over a second time duration, the first time duration preceding the second time duration; and
the operations further comprise validating the training of the machine learning model, the validating of the training of the machine learning model comprising:
receiving third input values for the first parameter;
calculating third modeled values for the second parameter using the physcis model;
generating second adjusted values for the second parameter using the trained machine learning model;
receiving third measurement values during a third duration that is between the first time duration and the second time duration; and
either determining that the machine learning model was not trained using anomalous operating conditions for the well system based on a comparison of the third measured values and the second adjusted values; or
determining that the second adjusted values are not valid based on a comparison of the second adjusted values and the third measured values, and, in response to determining that the second adjusted values are not valid, expanding an output range for the physics model, retraining the machine learning model, or both.

16. The medium of claim 13, wherein:
the physics model is a physics-based hydraulic model configured to calculate standpipe pressure, bottom hole effective circulating density, or both based at least partially on fluid rheology; and the second parameter comprises fluid rheology, fluid compressibility, or both in fluid in the well system.

\* \* \* \* \*